US011444581B2

United States Patent
Oka

(10) Patent No.: US 11,444,581 B2
(45) Date of Patent: Sep. 13, 2022

(54) INTEGRATED CIRCUIT AND LIGHT RECEIVER

(71) Applicant: Mitsubishi Electric Corporation, Tokyo (JP)

(72) Inventor: Toshihide Oka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 256 days.

(21) Appl. No.: 16/956,948

(22) PCT Filed: Mar. 15, 2018

(86) PCT No.: PCT/JP2018/010220
§ 371 (c)(1),
(2) Date: Jun. 22, 2020

(87) PCT Pub. No.: WO2019/176052
PCT Pub. Date: Sep. 19, 2019

(65) Prior Publication Data
US 2021/0006209 A1 Jan. 7, 2021

(51) Int. Cl.
*H03F 3/08* (2006.01)
*H03F 1/26* (2006.01)
(52) U.S. Cl.
CPC ............... *H03F 1/26* (2013.01); *H03F 3/087* (2013.01); *H03F 2200/372* (2013.01)
(58) Field of Classification Search
CPC ...... H03F 1/26; H03F 3/087; H03F 2200/372; H03F 2200/186; H03F 3/08; H03F 3/082; H03G 1/0047; H03G 3/3084

(Continued)

(56) References Cited

U.S. PATENT DOCUMENTS

| 2006/0034621 | A1 | 2/2006 | Denoyer |
| 2009/0051442 | A1* | 2/2009 | Seo .................. H03F 3/087 |
| | | | 330/308 |
| 2016/0149643 | A1 | 5/2016 | Kasai et al. |

FOREIGN PATENT DOCUMENTS

| JP | 2006-211381 A | 8/2006 |
| JP | 2008-507943 A | 3/2008 |

(Continued)

OTHER PUBLICATIONS

"11.3 Gbps Limiting Transimpedance Amplifier With RSSI", Data Sheet, Texas Instruments, Aug. 2011 (Fig. 15 to Fig.18).
(Continued)

*Primary Examiner* — Khanh V Nguyen
(74) *Attorney, Agent, or Firm* — Studebaker & Brackett PC

(57) ABSTRACT

An integrated circuit includes an amplifier for amplifying an electric current signal from an external light receiving element, and a low-pass filter. The low-pass filter has a resistor and a capacitor serial-connection in which multiple capacitive elements are serially connected. With respect to the resistor in the low-pass filter, one end thereof is connected to a power terminal to which the bias voltage is inputted, and the other end thereof is connected to an input terminal of the capacitor serial-connection and to a bias application electrode of the light receiving element through which the bias voltage is applied. With respect to the capacitor serial-connection in the low-pass filter, each connection terminal between two of the serially connected capacitive elements and an output terminal of the capacitor serial-connection, are connected to their respective capacitance terminals to which a ground potential as a reference for the bias voltage is connected selectively.

10 Claims, 5 Drawing Sheets

FIG. 3

(58) Field of Classification Search
USPC .............. 330/59, 308; 250/214 A, 214 AG
See application file for complete search history.

(56) References Cited

FOREIGN PATENT DOCUMENTS

| | | |
|---|---|---|
| JP | 2008-300726 A | 12/2008 |
| JP | 2016-063374 A | 4/2016 |
| JP | 2016-100422 A | 5/2016 |

OTHER PUBLICATIONS

International Search Report issued in PCT/JP2018/010220; dated Jun. 5, 2018.

* cited by examiner

INTEGRATED CIRCUIT AND LIGHT RECEIVER

TECHNICAL FIELD

The present application relates to an integrated circuit which includes a capacitive element for an external light receiving element.

BACKGROUND ART

In optical communications, a transimpedance amplifier is used that amplifies a weak electric current signal due to reception of light by a light receiving element such as a photodiode or the like, and then converts it into a voltage signal. As an integrated circuit which has such a transimpedance amplifier for optical communications formed therein, there is a circuit in which a low-pass filter for removing noise in a bias voltage for the photodiode is installed (for example, Patent Document 1, Non-Patent Document 1). The low-pass filter installed in the integrated circuit having the transimpedance amplifier formed therein, and the photodiode connected to the integrated circuit, are used as they are wired as shown in, for example, FIG. 15 and FIG. 18 of Non-Patent Document 1. In the case where the low-pass filter installed in the integrated circuit having the transimpedance amplifier formed therein is to be used, the low-pass filter may be placed at a position near the light receiving element. Thus, the low-pass filter installed in the integrated circuit is easy-to-use as a noise-removal filter.

In FIG. 16 and FIG. 17 of Non-Patent Document 1, a case is shown in which an avalanche photodiode is connected to the transimpedance amplifier. In Non-Patent Document 1, an external capacitive element, not an internal capacitive element, is connected to the anode of the avalanche photodiode.

CITATION LIST

Patent Document

Patent Document 1: Japanese National Publication of International Patent Application No. 2008-507943 (FIG. 4)

Non-Patent Document

Non-Patent Document 1: "11.3 Gbps Limiting Transimpedance Amplifier With RSSI", Data Sheet, Texas Instruments, August 2011 (FIG. 15 to FIG. 18)

SUMMARY OF THE INVENTION

Problems to be Solved by the Invention

With respect to a capacitive element in the low-pass filter installed in the integrated circuit having the transimpedance amplifier formed therein, the withstand voltage thereof is determined depending on the semiconductor manufacturing process for the integrated circuit. Thus, the capacitive element installed in the integrated circuit having the transimpedance amplifier formed therein is, even if it is usable with a bias voltage for a photodiode of about several volts, not applicable to a bias voltage for the avalanche photodiode that reaches as high as 20-30 volts.

A technique disclosed in the present description is to achieve an integrated circuit in which a low-pass filter that is applicable both to the bias voltage for the photodiode and to that for the avalanche photodiode, is installed.

Means for Solving the Problems

An integrated circuit disclosed as an example in the present description, is an integrated circuit that is formed on a semiconductor substrate and that serves to convert an electric current signal inputted from an external light receiving element, into a voltage signal. The integrated circuit includes: an amplifier for amplifying the electric current signal from the light receiving element and then converting it into the voltage signal; and a low-pass filter for performing filtering of a bias voltage to be applied to the light receiving element. The low-pass filter has a resistor and a capacitor serial-connection in which multiple capacitive elements are serially connected. With respect to the resistor in the low-pass filter, one end thereof is connected to a power terminal to which the bias voltage is inputted, and the other end thereof is connected to an input terminal of the capacitor serial-connection and to a bias application electrode of the light receiving element through which the bias voltage is applied. With respect to the capacitor serial-connection in the low-pass filter, each connection terminal between two of the serially connected capacitive elements, and an output terminal of the capacitor serial-connection, are connected to their respective capacitance terminals to which a ground potential as a reference for the bias voltage is connected selectively.

Effect of the Invention

According to the integrated circuit disclosed as an example in the present description, since the capacitance value of the installed low-pass filter is changeable, it is applicable both to the bias voltage for the photodiode and to that for the avalanche photodiode.

MODES FOR CARRYING OUT THE INVENTION

Embodiment 1

Figure 1:
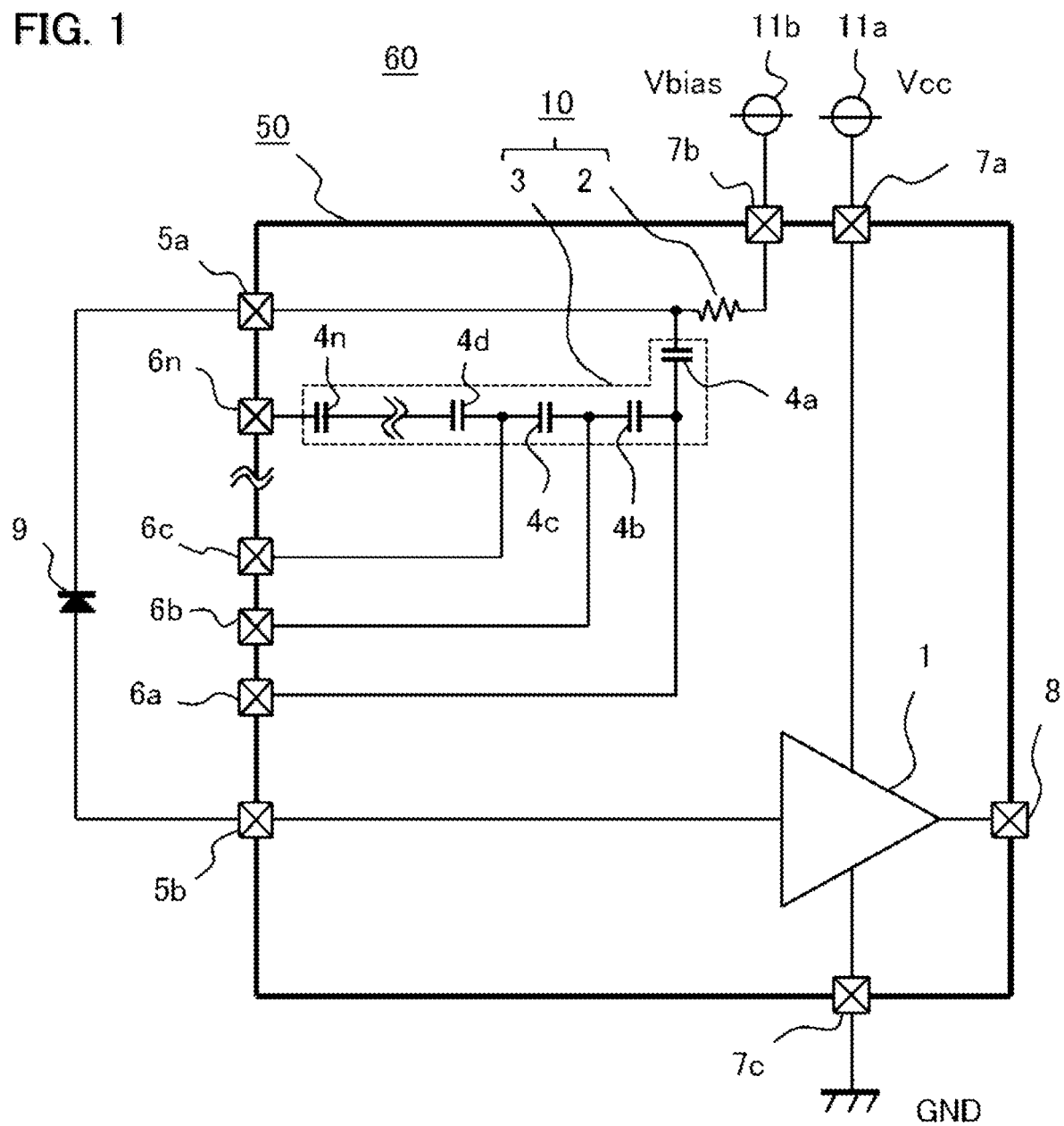
FIG. 1 is a diagram showing a circuit configuration of a light receiver and an integrated circuit according to Embodiment 1.
Figure 2:
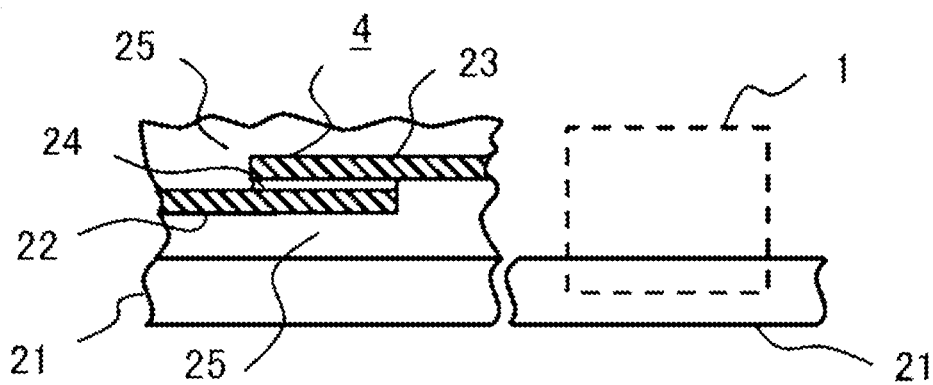
FIG. 2 is a cross-sectional view of a capacitive element in FIG. 1.

FIG. 1 is a diagram showing a circuit configuration of a light receiver and an integrated circuit according to Embodiment 1. FIG. 2 is a cross-sectional view of a capacitive element in FIG. 1. A light receiver 60 that receives an optical signal transmitted through an optical fiber includes: a light receiving element 9 for receiving the optical signal and outputting an electric current signal; and an integrated circuit 50 for converting the electric current signal inputted from the light receiving element 9, into a voltage signal. The integrated circuit 50 includes: a transimpedance amplifier (TIA) 1 for amplifying the weak current signal due to reception of light by the light receiving element 9 and then converting it into the voltage signal; a low-pass filter 10 for performing filtering in order to remove noise in a bias voltage Vbias to be supplied to the light receiving element 9; power terminals 7a, 7b, 7c; light-receiving-element connection terminals 5a, 5b to be connected to the light receiving element 9; multiple capacitance terminals 6a, 6b, 6c to 6n; and an output terminal 8. The low-pass filter 10 includes: a resistor 2; and a capacitor serial-connection 3 in which multiple capacitive elements 4a, 4b, 4c, 4d to 4n are serially connected. A connection point between the resistor 2 and a serial-connection input terminal that is one end of the capacitance serial-connection 3, is connected to the light-receiving-element connection terminal 5a, and respective connection points between the capacitive elements in the capacitance serial-connection 3 and a serial-connection output terminal that is the other end of the capacitance serial-connection 3, are connected to their respective capacitance terminals 6a, 6b, 6c to 6n. One end of the resistor 2 is connected to the power terminal 7b to be connected to a power source 11b, and the other end thereof is connected to the serial-connection input terminal of the capacitor serial-connection 3. The light receiving element 9 is, for example, an avalanche photodiode (APD). The anode of the light receiving element 9 is connected through the light-receiving-element connection terminal 5b to the transimpedance amplifier 1. The cathode (bias application electrode) of the light receiving electrode 9 is connected through the light-receiving-element connection terminal 5a to the low-pass filter 10, namely, connected to the connection point in the low-pass filter 10 between the resistor 2 and the serial-connection input terminal of the capacitance serial-connection 3.

To the transimpedance amplifier 1, a ground potential (GND potential) as a reference potential is applied through the power terminal 7c, and a voltage Vcc is supplied from a power source 11a connected to the power terminal 7a. The transimpedance amplifier 1 outputs, from the output terminal 8, an output signal obtained by amplifying the weak electric current signal of the light receiving element 9 inputted through the light-receiving-element connection terminal 5b, and then converting it into the voltage signal. In FIG. 1, a case is shown where the capacitive elements 4a, 4b, 4c, 4d to 4n are serially connected as they are arranged, respectively, in ascending order of distance from the cathode of the light receiving element 9. One end of the capacitive element 4a is connected to the cathode-side of the light receiving element 9, and the other end thereof is connected to the capacitive element 4b and the capacitance terminal 6a. With respect to each of the capacitive element 4b and its subsequent capacitive elements, both ends thereof are connected to the other capacitive elements. The both ends of the capacitive element 4b are connected to the capacitance terminals 6a, 6b, and the both ends of the capacitive element 4c are connected to the capacitance terminals 6b, 6c. In FIG. 1, the capacitive elements between the capacitive element 4d and the capacitive element 4n, and the capacitance terminals between the capacitance terminal 6c and the capacitance terminal 6n, are omitted from illustration. Note that, for these capacitive elements, numeral 4 is used collectively, and numerals 4a, 4b, 4c, 4d to 4n are used when they are to be described distinctively. For these capacitance terminals, numeral 6 is used collectively, and numerals 6a, 6b, 6c to 6n are used when they are to be described distinctively.

The integrated circuit 50 is formed on a semiconductor substrate 21, and the light-receiving-element connection terminals 5a, 5b, the capacitance terminals 6a, 6b, 6c to 6n, the power terminals 7a, 7b, 7c, and the output terminal 8 are each, for example, a wire bonding pad for connecting a wire thereto. Note that the light receiving element 9 may be an avalanche photodiode or a PIN-type photodiode.

The capacitive elements 4 are each, for example, an MIM (Metal Insulator Metal)-type capacitor. In FIG. 2, the capacitive element 4 as an MIM (Metal Insulator Metal)-type capacitor is shown. The capacitive element 4 is formed above the semiconductor substrate 21 on which the transimpedance amplifier 1 is formed. The capacitive element 4 has a first electrode 22, a second electrode 23 and an insulative film 24 formed between the first electrode 22 and the second electrode 23, and is insulated by an insulative film 25 from the other capacitive elements 4, the resistor 2, the transimpedance amplifier 1 and the like. With respect to the capacitive element 4 such as an MIM-type capacitor or the like, to be formed by a semiconductor manufacturing process, the withstand voltage thereof is determined depending on a semiconductor manufacturing process for the integrated circuit 50. In Embodiment 1, the multiple capacitive elements 4 are serially connected, so that a value of the effective voltage applied to each of the capacitive elements 4 is reduced. Further, the capacitance value and the withstand voltage of the capacitor serial-connection 3 in the low-pass filter 10 can be changed arbitrarily by selecting the capacitance terminal 6 to be connected to a ground potential (GND potential), namely, to be grounded.

Figure 3:
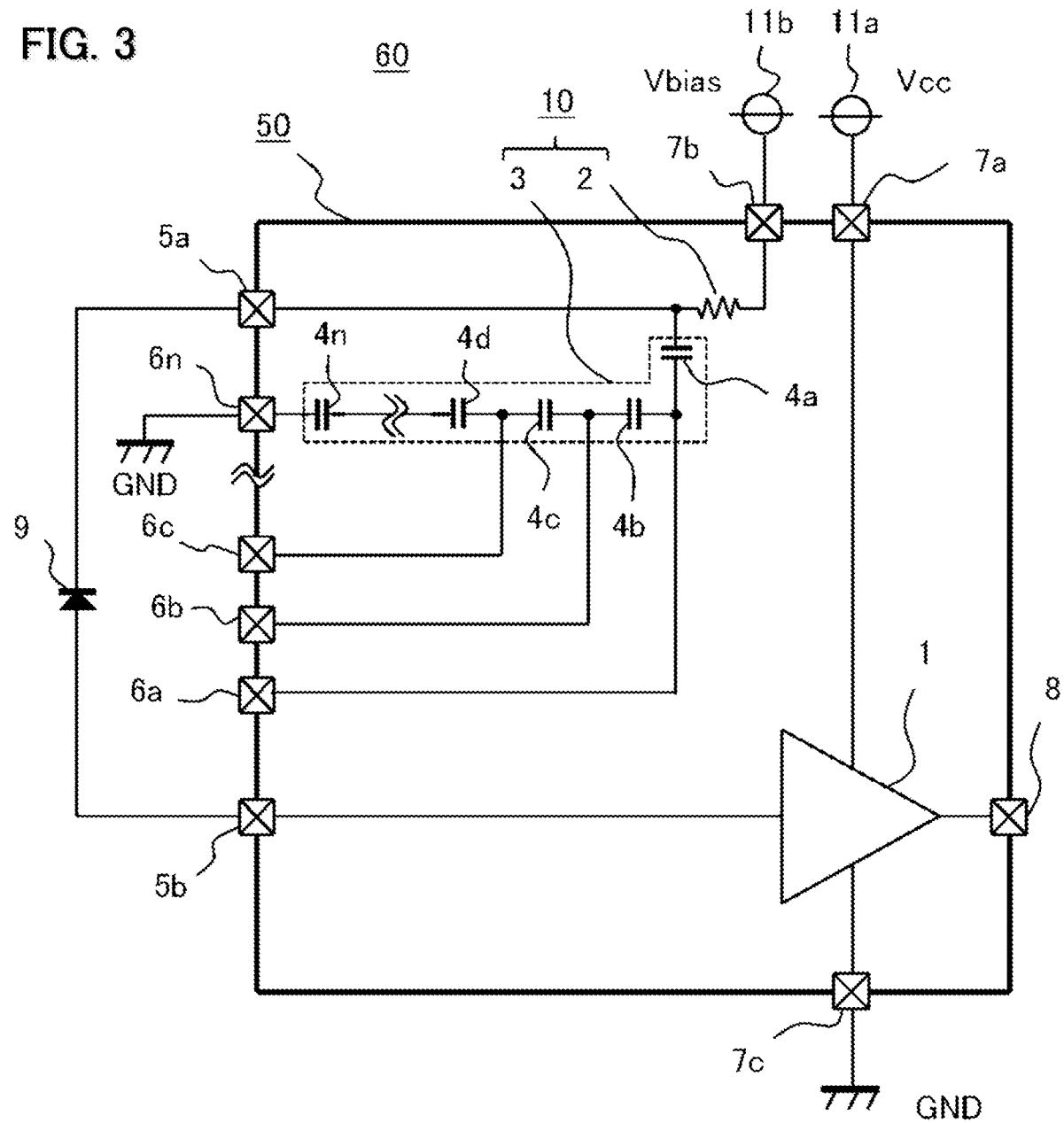
FIG. 3 is a diagram showing a first modified example of the capacitance value in the integrated circuit of FIG. 1.
Figure 4:
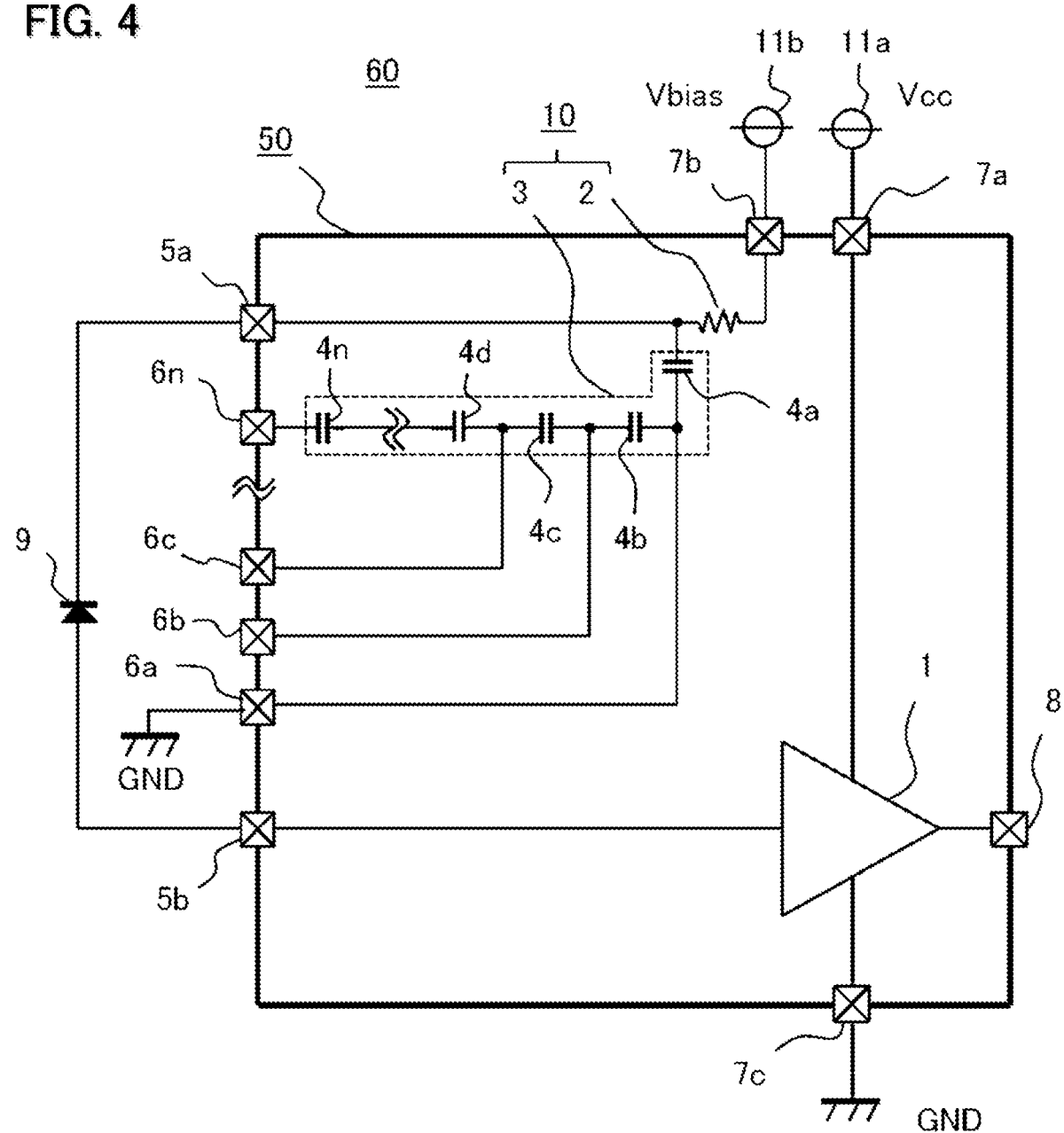
FIG. 4 is a diagram showing a second modified example of the capacitance value in the integrated circuit of FIG. 1.

Using FIG. 3 and FIG. 4, examples of how to determine the capacitance value of the capacitor serial-connection 3 will be described. FIG. 3 is a diagram showing a first modified example of the capacitance value in the integrated circuit of FIG. 1, and FIG. 4 is a diagram showing a second modified example of the capacitance value in the integrated circuit of FIG. 1. For example, let's assume a case where the capacitive elements 4a, 4b, 4c, 4d to 4n each have a capacitance value of C [F] and a withstand voltage of Vrs [V]. When, as shown in FIG. 3, only the capacitance terminal 6n connected merely to the capacitive element 4n is grounded, the capacitance value of the capacitor serial-connection 3 becomes C/n [F] and the withstand voltage of the capacitor serial-connection 3 becomes nVrs [V]. Thus, as the bias voltage Vbias to be applied to the capacitor serial-connection 3, it is allowed to apply a voltage of up to n times the withstand voltage of the single capacitive element 4. Further, when, as shown in FIG. 4, the capacitor serial-connection is grounded only at the capacitance terminal 6a connected to the capacitive element 4a and the capacitive element 4b, the capacitance value of the capacitor serial-connection 3 becomes C [F] and the withstand voltage of the capacitor serial-connection 3 becomes Vrs [V]. Note that the capacitance values of the capacitive elements 4 are not limited to the same values, and may include different capacitance values.

According to the integrated circuit 50 of Embodiment 1, by use of the multiple capacitive elements 4 each formed by a semiconductor manufacturing process used for a general semiconductor integrated circuit whose withstand voltage is about several volts, the low-pass filter 10 is achieved that is applicable to the bias voltage for the avalanche photodiode that reaches as high as 20-30 volts. Further, according to the integrated circuit 50 of Embodiment 1, the capacitance terminal 6 used for grounding, for example, a wire bonding pad, is selectable by wire bonding. Thus, in the same integrated circuit, it is possible to use differently the low-pass filter 10 between the states of having respective optimum capacitance values and withstand voltages for the photodiode and the avalanche photodiode.

As described above, the integrated circuit 50 of Embodiment 1 is an integrated circuit that is formed on the semiconductor substrate 21 and that serves to convert an electric current signal inputted from the external light receiving element 9, into a voltage signal. The integrated circuit 50 includes an amplifier (transimpedance amplifier 1) for amplifying the electric current signal from the light receiving element 9 and then converting it into the voltage signal, and the low-pass filter 10 for performing filtering of the bias voltage Vbias to be applied to the light receiving element 9. The low-pass filter 10 has the resistor 2 and the capacitor serial-connection 3 in which the multiple capacitive elements 4 are serially connected. With respect to the resistor 2 in the low-pass filter 10, one end thereof is connected to the power terminal 7b to which the bias voltage Vbias is inputted, and the other end thereof is connected to the input terminal of the capacitor serial-connection 3 and to the bias application electrode (cathode) of the light receiving element 9 through which the bias voltage Vbias is applied. With respect to the capacitor serial-connection 3 in the low-pass filter 10, each connection terminal between two of the serially connected capacitive elements 4, and the output terminal of the capacitor serial-connection, are connected to their respective capacitance terminals 6 to which the ground potential (GND potential) as a reference for the bias voltage Vbias is connected selectively. Because of such a configuration, since the capacitance value of the installed low-pass filter 10 is changeable, the integrated circuit 50 of Embodiment 1 is applicable both to the bias voltage for the photodiode and to that for the avalanche photodiode, and is thus applicable to either the photodiode or the avalanche photodiode as the light receiving element 9.

The light receiver 60 of Embodiment 1 includes the light receiving element 9 for receiving an optical signal, and the integrated circuit 50 for converting an electric current signal inputted from the light receiving element 9, into a voltage signal. The integrated circuit 50 is formed on the semiconductor substrate 21, and includes an amplifier (transimpedance amplifier 1) for amplifying the electric current signal from the light receiving element 9 and then converting it into the voltage signal, and the low-pass filter 10 for performing filtering of the bias voltage Vbias to be applied to the light receiving element 9. The low-pass filter 10 has the resistor 2 and the capacitor serial-connection 3 in which the multiple capacitive elements 4 are serially connected. With respect to the resistor 2 in the low-pass filter 10, one end thereof is connected to the power terminal 7b to which the bias voltage Vbias is inputted, and the other end thereof is connected to the input terminal of the capacitor serial-connection 3 and to the bias application electrode (cathode) of the light receiving element 9 through which the bias voltage Vbias is applied. With respect to the capacitor serial-connection 3 in the low-pass filter 10, each connection terminal between two of the serially connected capacitive elements 4, and the output terminal of the capacitor serial-connection, are connected to their respective capacitance terminals 6 to which the ground potential (GND potential) as a reference for the bias voltage Vbias is connected selectively. Because of such a configuration, since the capacitance value of the installed low-pass filter 10 is changeable, the light receiver 60 of Embodiment 1 is applicable both to the bias voltage for the photodiode and to that for the avalanche photodiode, and is thus applicable to either the photodiode or the avalanche photodiode as the light receiving element 9.

Embodiment 2

Figure 5:
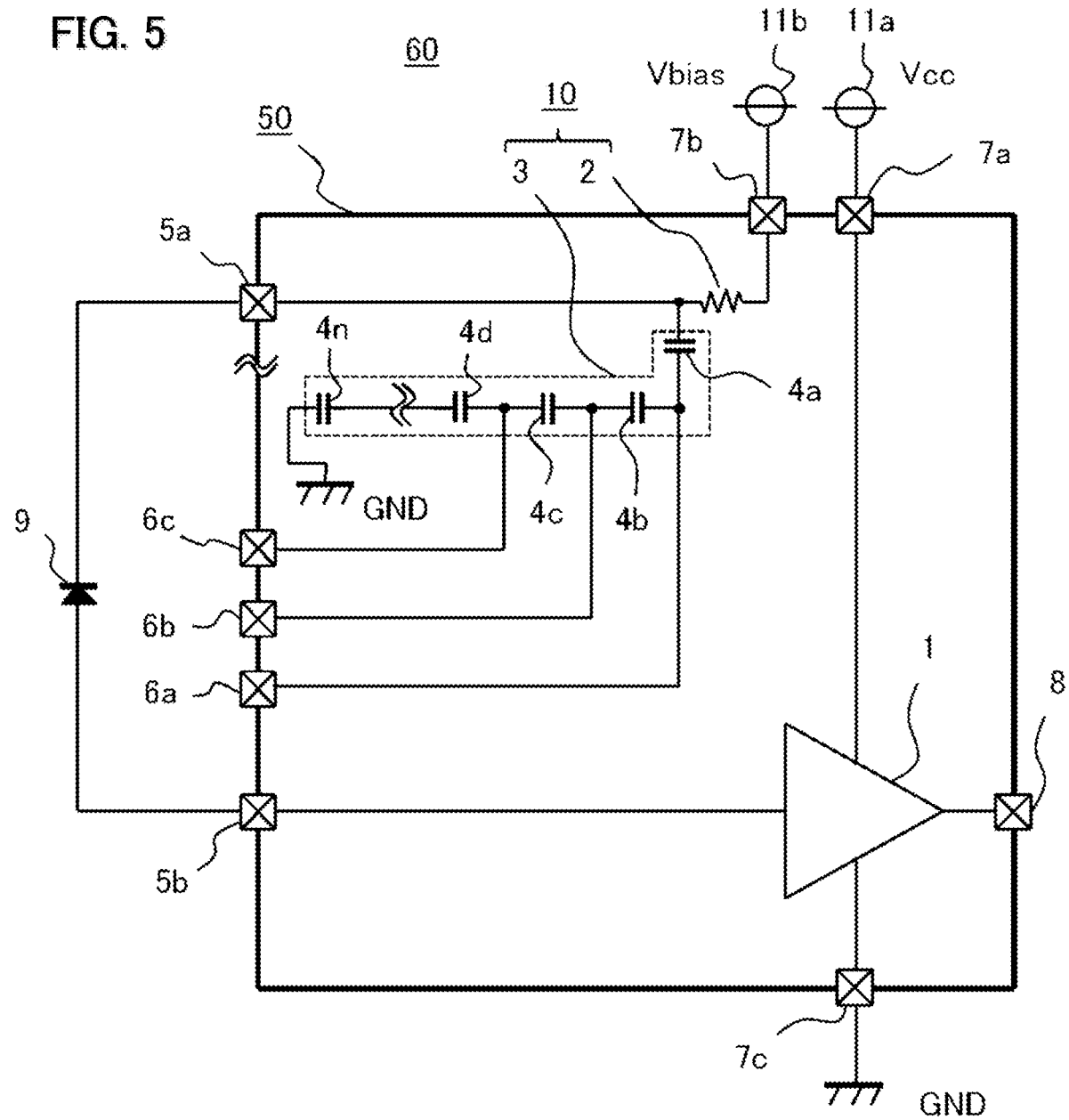
FIG. 5 is a diagram showing a circuit configuration of a light receiver and an integrated circuit according to Embodiment 2.
Figure 6:
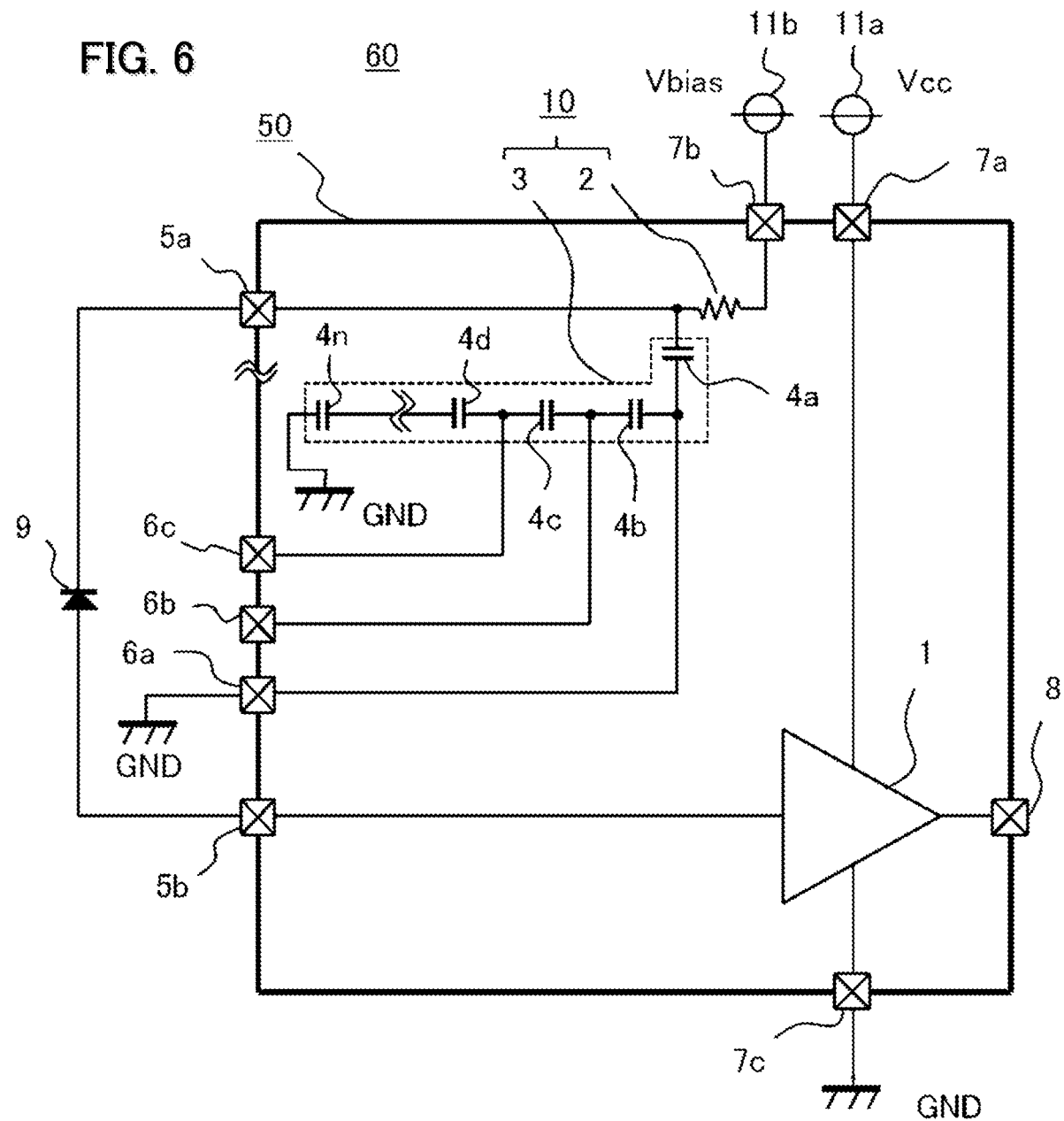
FIG. 6 is a diagram showing a modified example of the capacitance value in the integrated circuit of FIG. 5.

FIG. 5 is a diagram showing a circuit configuration of a light receiver and an integrated circuit according to Embodiment 2, and FIG. 6 is a diagram showing a modified example of the capacitance value in the integrated circuit of FIG. 5. The light receiver 60 and the integrated circuit 50 of Embodiment 2 differ from the integrated circuit 50 of Embodiment 1 in that, with respect to the capacitive element 4n placed farthest from the cathode of the light receiving element 9, its one end not connected to the other capacitive element 4, namely, the serial-connection output terminal of the capacitor serial-connection 3, is always grounded. For example, the serial-connection output terminal of the capacitor serial-connection 3 is always grounded via a through-hole or the like.

According to the integrated circuit 50 of Embodiment 2, the capacitance terminal 6n in Embodiment 1 to which the serial-connection output terminal of the capacitor serial-connection 3 is connected is replaced with the through-hole, so that it is possible to eliminate an area corresponding to one capacitance terminal, for example, to omit an area corresponding to one wire bonding pad and to eliminate the wire bonding step therefor. The integrated circuit 50 of Embodiment 2 has no electrical effect if the capacitance terminal 6 is grounded that is other than the serial-connection output terminal of the capacitor serial-connection 3 and to which the connection point between two capacitive elements 4 is connected. Note that, in FIG. 5 and FIG. 6, a case is shown where the capacitance terminal 6n in FIG. 1 is deleted; however, it is allowed that the capacitance terminal 6n is provided and the capacitance terminal 6n is always grounded via a through-hole or the like. If this is the case, it is possible to eliminate the wire bonding step for grounding the capacitance terminal 6n.

Using FIG. 5 and FIG. 6, examples of how to determine the capacitance value of the capacitor serial-connection 3 will be described. For example, let's assume a case where the capacitive elements $4a$, $4b$, $4c$, $4d$ to $4n$ each have a capacitance value of C [F] and a withstand voltage of Vrs [V]. When, as shown in FIG. 5, only one end of the capacitive element $4n$, namely, the serial-connection output terminal of the capacitor serial-connection 3, is grounded, the capacitance value of the capacitor serial-connection 3 becomes C/n [F] and the withstand voltage of the capacitor serial-connection 3 becomes nVrs [V]. Thus, as the bias voltage Vbias to be applied to the capacitor serial-connection 3, it is allowed to apply a voltage of up to n times the withstand voltage of the single capacitive element 4. Further, when, as shown in FIG. 6, the capacitor serial-connection is grounded at the capacitance terminal $6a$ connected to the capacitive element $4a$ and the capacitive element $4b$, the capacitance value of the capacitor serial-connection 3 becomes C [F] and the withstand voltage of the capacitor serial-connection 3 becomes Vrs [V]. Note that the capacitance values of the capacitive elements 4 are not limited to the same values, and may include different capacitance values.

Like the integrated circuit 50 of Embodiment 1, since the capacitance value of the installed low-pass filter 10 is changeable, the integrated circuit 50 of Embodiment 2 is applicable both to the bias voltage for the photodiode and to that for the avalanche photodiode, and is thus applicable to either the photodiode or the avalanche photodiode as the light receiving element 9.

As described above, the integrated circuit 50 of Embodiment 2 is an integrated circuit that is formed on the semiconductor substrate 21 and that serves to convert an electric current signal inputted from the external light receiving element 9, into a voltage signal. The integrated circuit 50 includes an amplifier (transimpedance amplifier 1) for amplifying the electric current signal from the light receiving element 9 and then converting it into the voltage signal, and the low-pass filter 10 for performing filtering of the bias voltage Vbias to be applied to the light receiving element 9. The low-pass filter 10 has the resistor 2 and the capacitor serial-connection 3 in which the multiple capacitive elements 4 are serially connected. With respect to the resistor 2 in the low-pass filter 10, one end thereof is connected to the power terminal 7b to which the bias voltage Vbias is inputted, and the other end thereof is connected to the input terminal of the capacitor serial-connection 3 and to the bias application electrode (cathode) of the light receiving element 9 through which the bias voltage Vbias is applied. With respect to the capacitor serial-connection 3 in the low-pass filter 10, each connection terminal between two of the serially connected capacitive elements 4 is connected to the capacitance terminal 6 to which the ground potential (GND potential) as a reference for the bias voltage Vbias is connected selectively, and the output terminal of the capacitor serial-connection is fixed at the ground potential (GND potential). Because of such a configuration, since the capacitance value of the installed low-pass filter 10 is changeable, the integrated circuit 50 of Embodiment 2 is applicable both to the bias voltage for the photodiode and to that for the avalanche photodiode, and is thus applicable to either the photodiode or the avalanche photodiode as the light receiving element 9.

The light receiver 60 of Embodiment 2 includes the light receiving element 9 for receiving an optical signal, and the integrated circuit 50 for converting an electric current signal inputted from the light receiving element 9, into a voltage signal. The integrated circuit 50 is formed on the semiconductor substrate 21, and includes an amplifier (transimpedance amplifier 1) for amplifying the electric current signal from the light receiving element 9 and then converting it into the voltage signal, and the low-pass filter 10 for performing filtering of the bias voltage Vbias to be applied to the light receiving element 9. The low-pass filter 10 has the resistor 2 and the capacitor serial-connection 3 in which the multiple capacitive elements 4 are serially connected. With respect to the resistor 2 in the low-pass filter 10, one end thereof is connected to the power terminal 7b to which the bias voltage Vbias is inputted, and the other end thereof is connected to the input terminal of the capacitor serial-connection 3 and to the bias application electrode (cathode) of the light receiving element 9 through which the bias voltage Vbias is applied. With respect to the capacitor serial-connection 3 in the low-pass filter 10, each connection terminal between two of the serially connected capacitive elements 4 is connected to the capacitance terminal 6 to which the ground potential (GND potential) as a reference for the bias voltage Vbias is connected selectively, and the output terminal of the capacitor serial-connection is fixed at the ground potential (GND potential). Because of such a configuration, since the capacitance value of the installed low-pass filter 10 is changeable, the light receiver 60 of Embodiment 2 is applicable both to the bias voltage for the photodiode and to that for the avalanche photodiode, and is thus applicable to either the photodiode or the avalanche photodiode as the light receiving element 9.

It is noted that the capacitive element 4 is not limited to a single capacitive element, and may be divided into multiple capacitive elements. Further, unlimited combination of the respective embodiments and any appropriate modification/omission in the embodiments may be made to the extent without causing contradiction.

DESCRIPTION OF REFERENCE NUMERALS AND SIGNS

1: transimpedance amplifier, 2: resistor, 3: capacitor serial-connection, 4, 4a, 4b, 4c, 4d, 4n: capacitive element, 6, 6a, 6b, 6c, 6n: capacitance terminal, 7a, 7b, 7c: power terminal, 9: light receiving element, 10: low-pass filter, 21: semiconductor substrate, 50: integrated circuit, 60: light receiver, Vbias: bias voltage.

The invention claimed is:

1. An integrated circuit formed on a semiconductor substrate, for converting an electric current signal inputted from an external light receiving element, into a voltage signal, said integrated circuit comprising:
  an amplifier for amplifying the electric current signal from the external light receiving element and then converting it into the voltage signal; and
  a low-pass filter for performing filtering of a bias voltage to be applied to the external light receiving element;
  wherein the low-pass filter has a resistor and a capacitor serial-connection in which multiple capacitive elements are serially connected;
  wherein one end of the resistor is connected to a power terminal to which the bias voltage is inputted, and the other end of the resistor is connected to an input terminal of the capacitor serial-connection and to a bias application electrode of the external light receiving element through which the bias voltage is applied;
  wherein each connection terminal between two of the serially connected capacitive elements in the capacitor serial-connection, and an output terminal of the capacitor serial-connection, are connected to their respective capacitance terminals to which a ground potential as a reference for the bias voltage is connected selectively; and
  wherein the capacitance terminal is a wire bonding pad formed in the integrated circuit.

2. The integrated circuit of claim 1, wherein the capacitive element is an MIM-type capacitor.

3. A light receiver comprising:
  the integrated circuit of claim 1; and the external light receiving element for receiving an optical signal, wherein an electric current signal inputted from the external light receiving element is converted into a voltage signal.

4. The light receiver of claim 3, wherein, when the external light receiving element is an avalanche photodiode, the ground potential is connected to the capacitance terminal corresponding to, in the capacitor serial-connection, a portion on its side nearer to the output terminal.

5. The light receiver of claim 3, wherein, when the external light receiving element is a photodiode for which the bias voltage is lower than that for an avalanche photodiode, the ground potential is connected to the capacitance terminal corresponding to, in the capacitor serial-connection, a portion on its side nearer to the input terminal.

6. A light receiver comprising:
the integrated circuit of claim 2; and the external light receiving element for receiving an optical signal, wherein an electric current signal inputted from the external light receiving element is converted into a voltage signal.

7. An integrated circuit formed on a semiconductor substrate, for converting an electric current signal inputted from an external light receiving element, into a voltage signal, said integrated circuit comprising:
- an amplifier for amplifying the electric current signal from the external light receiving element and then converting it into the voltage signal; and
- a low-pass filter for performing filtering of a bias voltage to be applied to the external light receiving element;
- wherein the low-pass filter has a resistor and a capacitor serial-connection in which multiple capacitive elements are serially connected;
- wherein one end of the resistor is connected to a power terminal to which the bias voltage is inputted, and the other end of the resistor is connected to an input terminal of the capacitor serial-connection and to a bias application electrode of the external light receiving element through which the bias voltage is applied; and
- wherein each connection terminal between two of the serially connected capacitive elements in the capacitor serial-connection is connected to a capacitance terminal to which a ground potential as a reference for the bias voltage is connected selectively, and an output terminal of the capacitor serial-connection is fixed at the ground potential, and the capacitance terminal is a wire bonding pad formed in the integrated circuit.

8. A light receiver comprising:
the integrated circuit of claim 7; and the external light receiving element for receiving an optical signal; wherein an electric current signal inputted from the external light receiving element is converted into a voltage signal, and;
wherein, when the external light receiving element is an avalanche photodiode, the ground potential is not connected to any of the capacitance terminals.

9. The integrated circuit of claim 7, wherein the capacitive element is an MIM-type capacitor.

10. A light receiver comprising:
the integrated circuit of claim 7; and the external light receiving element for receiving an optical signal, wherein an electric current signal inputted from the external light receiving element is converted into a voltage signal.

* * * * *